United States Patent [19]

Hayashi et al.

[11] Patent Number: 4,500,743
[45] Date of Patent: Feb. 19, 1985

[54] AMORPHOUS SEMICONDUCTOR SOLAR CELL HAVING A GRAINED TRANSPARENT ELECTRODE

[75] Inventors: Yutaka Hayashi; Mithuyuki Yamanaka, both of Sakura; Hideyo Iida, Ueno; Nobuyasu Shiba, Ueno; Hideyuki Karasawa, Ueno; Toshio Mishuku, Ueno; Atsuo Itou, Ueno, all of Japan

[73] Assignees: Kogyo Gijutsuin; Taiyo Yuden Kabushiki Kaisha, both of Tokyo, Japan

[21] Appl. No.: 428,712

[22] Filed: Sep. 30, 1982

[30] Foreign Application Priority Data

Oct. 1, 1981 [JP] Japan ................. 56-154749

[51] Int. Cl.³ .............................. H01L 31/04
[52] U.S. Cl. ..................... 136/258; 136/256
[58] Field of Search ........... 136/256, 258 AM, 260

[56] References Cited

PUBLICATIONS

IEEE Electron Device Letter, vol. ED1-3, No. 5, May, 1982, pp. 114 and 115.
RCA Review, vol. 38, Jun., 1977, pp. 212-225.
IEEE Transactions on Electron Devices, vol. ED-24, No. 4, Apr. 1977, pp. 449-453.
Iles et al., "Design Factors for Transparent Conducting Layers in Solar Cells", Conf. Record 12th IEEE Photovoltaic Specialists Conf., Nov. 15-18, 1976, pp. 978-988.
Carlson, "Amorphous Silicon Solar Cells", *IEEE Transactions on Electron Devices*," vol. Ed-24 Apr., 1977, pp. 449-453.
Takakura et al., "Low-Cost High-Efficiency $SnO_2/n^+$-p Si Heteroface Solar Cell Fabricated by Paint-On-Diffusant Method", *Conference Record, 14th IEEE Photovoltaic Specialists Conf.* San Diego, CA, Jan. 7-10, 1980 published May, 1980 pp. 1186-1191.

*Primary Examiner*—Brian E. Hearn
*Assistant Examiner*—Hunter L. Auyang
*Attorney, Agent, or Firm*—Armstrong, Nikaido, Marmelstein & Kubovcik

[57] ABSTRACT

An amorphous semiconductor solar cell which comprises a glass substrate and a transparent electrode coated on the substrate. The device also comprises an amorphous semiconductor layer on the transparent electrode, and a rear electrode on the amorphous layer, wherein the average grain diameter of the surface of the transparent electrode ranges from 0.1 μm to 2.5 μm.

5 Claims, 6 Drawing Figures

F I G. 6
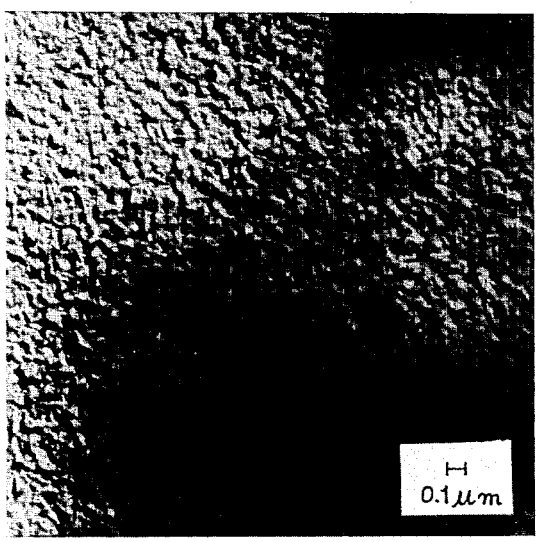

AMORPHOUS SEMICONDUCTOR SOLAR CELL HAVING A GRAINED TRANSPARENT ELECTRODE

BACKGROUND OF THE INVENTION

1. Field of the Invention

This invention relates to an amorphous semiconductor solar battery using an amorphous silicon, germanium or the like.

2. Description of the Prior Art

In prior art solar batteries, as shown in FIG. 1, for instance, a glass substrate a is coated, with a transparent electrode b, an amorphous silicon layer c comprising a p layer $c_1$, an i layer $c_2$ and an n layer $c_3$ (or n-i-p layers) and a rear surface electrode d. This type of solar battery is advantageous in that the glass substrate is low in cost and easily provides a flat front surface thereof which is transparent so that light rays enter the battery from the glass substrate side thereof. Additionally the glass substrate is an insulator, so that it is possible to form plural battery elements thereon and connect them in series or parallel. However, the solar battery of this type is disadvantageous in that the conversion efficiency thereof is only about 2%, and is lower than that of a recently developed so called reverse type p-i-n solar battery in which a stainless steel substrate is coated with an amorphous silicon layer composed of p-i-n layers and a transparent electrode or of a conventional solar battery in which a glass substrate is coated with a transparent electrode, a p layer of amorphous silicon carbide including carbon, i and n layers of amorphous silicon, and a rear surface electrode.

In a conventional solar battery having the foregoing construction, it has been usual to use a transparent electrode of the type used for a liquid crystal indication element or the like. In such a device the sheet resistance thereof is to be as small as possible and at the same time the solar light transmission rate thereof is to be as high as possible. The transparent electrode thereof is so clear that the other side of the electrode can be seen clearly therethrough with the naked eye, and the average grain diameter thereof is less than about 0.05 μm.

SUMMARY OF THE INVENTION

This invention has for its object to improve the conversion efficiency of this type of solar battery (or solar cell).

The present invention is based upon the finding of the inventors that the transparent electrode has an influence on the conversion efficiency of the solar battery, and the relations between the conversion efficiency of the solar battery and the surface condition of a transparent electrode of indium oxide, indium tin oxide, or tin oxide. As a result thereof, it has been found that when the average grain diameter of the surface of the transparent electrode becomes larger than about 0.1 μm, the cloudiness or the white turbidity thereof caused by diffused reflection of the light ray at the front surface thereof and at the interior thereof becomes more significant, and consequently the transparency thereof becomes lower, but the conversion efficiency thereof is very substantially increased in comparison with that of the foregoing conventional solar battery. The present invention is characterized in that the average grain diameter of the surface of the transparent electrode ranges from 0.1 to 2.5 μm, whereby the conversion efficiency obtained ranges from about 4 to 7%.

BRIEF DESCRIPTION OF THE DRAWINGS

FIGS. 4–6 are microphotographs showing surface morphology of solar batteries.

DETAILED DESCRIPTION OF THE PREFERRED EMBODIMENTS

Figure 1:
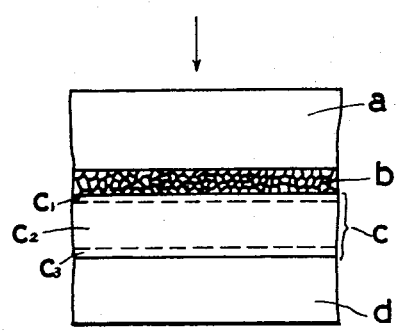
FIG. 1 is a partial cross-section of a prior art semiconductor solar battery.

The transparent electrode of this invention is manufactured by a process used hitherto for forming a transparent conductive film such as a sputtering process, an electron beam vacuum evaporation process, a chemical vapor deposition (CVD) process, a spray process, a dipping process, a resistant heat vacuum evaporation process, an ion plating process, a plasma CVD process and others.

EXAMPLE 1

For examining the relations between the average gain diameter of the surface of the transparent electrode and the conversion efficiency of the solar battery, three kinds of transparent electrodes of tin oxide ($SnO_2$), indium oxide ($In_2O_3$) and indium tin oxide (ITO) are formed by a spraying process. An average grain diameter ranging from 0.1 to 3.0 μm of grains on the surface of each of the transparent electrodes is observed with an electron microscope using a replica process. The manufacturing conditions of each of the transparent electrodes is as follows:

(1) Tin oxide film $SnCl_4.5H_2O$ and $SbCl_3$ are used as starting materials and each of varied mixtures thereof in which the weight of Sb is 0.01–3% by weight in relation to the weight of Sn is dissolved in a 1% by volume, aqueous solution of hydrochloric acid so that each 10%, by weight, of spraying liquid of the mixture in solution concentration is prepared. Each of the spraying liquids is sprayed on one of the glass substrates, product #7059 by Corning Co., at heated temperatures ranging from 380° C. to 450° C. so that antimony doped tin oxide films which range from 0.1–3.0 μm in the average grain diameter are deposited on the glass substrates, as shown in the following table, but whose sheet resistances are all 50 Ω/sq.

TABLE 1

| | | SnO₂ film (Sb) by spray process | | | | |
|---|---|---|---|---|---|---|
| Average Grain diameter (μm) | Substrate temperature (°C.) | Carrier gas flow rate (l/min) | Sn + Sb Solution concentration wt % | Antimony concentration wt % Sb/Sn | Grain growth time min | Film thickness μm |
| 0.1 | 380 | 20 | 10 | 3 | 3¾ | 0.3 |
| 0.3 | 380 | 20 | 10 | 1.0 | 7½ | 0.6 |

TABLE 1-continued

| | | | SnO$_2$ film (Sb) by spray process | | | |
|---|---|---|---|---|---|---|
| Average Grain diameter ($\mu$m) | Substrate temperature (°C.) | Carrier gas flow rate (l/min) | Sn + Sb Solution concentration wt % | Antimony concentration wt % Sb/Sn | Grain growth time min | Film thickness $\mu$m |
| 0.4 | 380 | 20 | 10 | 0.5 | 10 | 0.8 |
| 0.6 | 400 | 20 | 10 | 0.3 | 11 | 1.0 |
| 0.9 | 400 | 20 | 10 | 0.2 | 16 | 1.5 |
| 1.1 | 400 | 20 | 10 | 0.1 | 20 | 2.0 |
| 1.4 | 420 | 20 | 10 | 0.05 | 26 | 2.5 |
| 2.0 | 420 | 20 | 10 | 0.04 | 34 | 3.3 |
| 2.2 | 440 | 20 | 10 | 0.01 | 34 | 3.6 |
| 2.8 | 450 | 20 | 10 | 0.01 | 35 | 4.2 |
| 3.0 | 450 | 20 | 10 | 0.01 | 38 | 4.5 |

(2) Indium Oxide Film

InCl$_3$.4H$_2$O is dissolved in an aqueous solution of 1% by volume of hydrochloric acid so that a spraying liquid having 10% of weight concentration of In is prepared. The spraying liquid is sprayed on respective glass substrates of varied heat temperature ranging from 450° to 550° C. so that the resultant liquid films thus formed may be varied in thickness and there are formed by deposition thereon respective indium oxide films which are different in the average grain diameter ranging from 0.1 to 3.0 $\mu$m, but the sheet resistances are all 20 $\Omega$/sq.

(3) Indium Tin Oxide Film

InCl$_3$.4H$_2$O and SnCl$_4$.4H$_2$O are used as starting materials and each of various mixtures thereof in which the weight of Sn is 0.01-2% by weight in relation to the weight of In, are dissolved in a 1%, by volume, aqueous solution of hydrochloric acid so that 10% concentrations, by weight, spraying liquid mixtures are prepared.

Each of the spraying liquids is sprayed on glass substrates, products #7059 by Corning Co., which are heated to temperatures varying in the range of 450°-550° C. Indium tin oxide films which are varied in the average grain diameter ranging from 0.1 to 3.0 $\mu$m but whose sheet resistances are all 10 $\Omega$/sq. are thus deposited on the respective glass substrates.

Thereafter, an amorphous silicon layer is formed on each of the above three kinds of films under the same conditions. A parallel plate type RF glow discharging process is used for forming the layer, wherein a hydrogen base monosilane (Silane 10% by volume), a hydrogen base diborane (diborane 1000 ppm) and a hydrogen base phosphine (Phosphine 1000 ppm) are used, under conditions wherein the temperature of the substrate is 250° C., the degree of vacuum is 1 Torr and the gas flowing rate is 100 SCCM (Standard C.C. per Min.). There are thus deposited in sequence about 100 Å of a p layer (the content of B$_2$H$_6$ in SiH$_4$ is 0.3% by volume), about 5000 Å of an i layer, and about 300 Å of an n layer (the content of PH$_3$ in SiH$_4$ is 0.8% by volume). Thereafter, each amorphous silicon layer thus formed is subjected to a vacuum evaporation process for forming a rear electrode layer of aluminum of about 1 $\mu$m.

Three kinds of solar battery elements each comprising a glass substrate/transparent electrode/p-i-n/rear electrode are thus formed by the above described processes.

Figure 2:
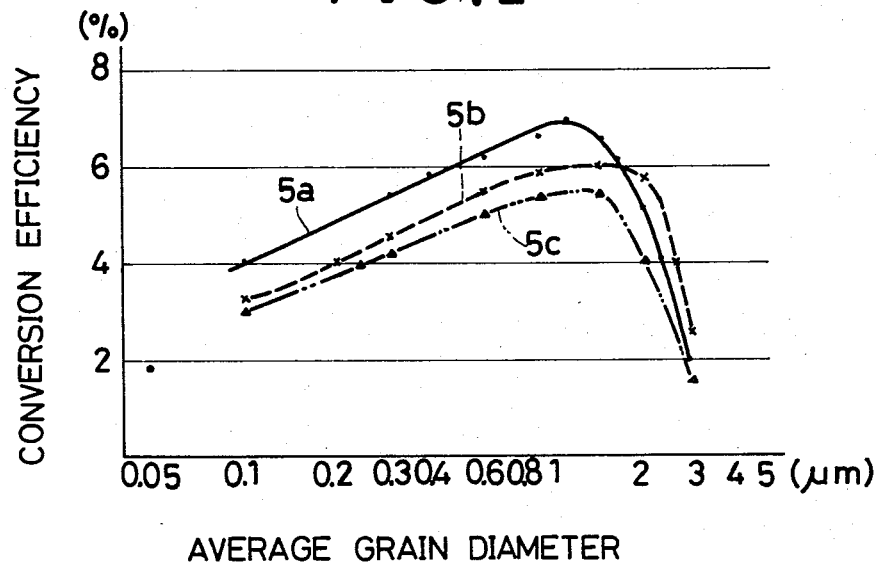
FIG. 2 is a graph of conversion efficiency v. grain size for three examples of the present invention.

FIG. 2 shows the results of experiments for examining how the varied average grain diameters of each transparent electrode of the three kinds of solar batteries influence the conversion efficiency of the solar battery. Each solar battery is 4 mm$^2$ in area, and the irradiation light rays are from a solar simulator (AM-1) with an intensity of 80 mW/cm$^2$.

As shown in FIG. 2, 5a denotes a characteristic curve for tin oxide, 5b is that for indium tin oxide, and 5c is that for indium oxide. All of these three kinds of transparent electrodes have the same characteristic in that the conversion efficiency is improved as the average grain diameter is increased and also the conversion efficiency becomes maximum in the range of about 1.1-1.5 $\mu$m. Further the conversion efficiency declines with an average grain diameter larger than about 1.5 $\mu$m. A conversion efficiency greater than 4% is obtained with the tin oxide in the range of 0.1-2.5 $\mu$m, the indium tin oxide in the range of 0.2-2.5 $\mu$m, and the indium oxide in the range of 0.24-2.0 $\mu$m.

Figure 3:
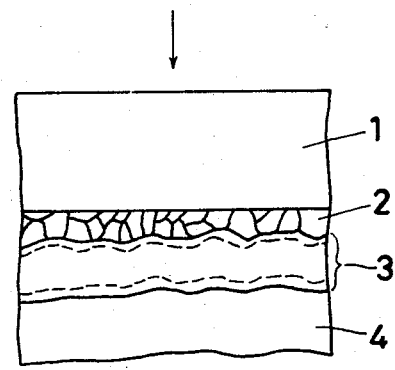
FIG. 3 is a partial cross-section of a semiconductor solar battery according to the present invention.

FIG. 3 shows diagrammatically the construction of a solar battery of the present invention using a transparent electrode having an average grain diameter of 0.1 $\mu$m or more, wherein 1 is a glass substrate, 2 is a transparent electrode, 3 is an amorphous silicon layer and 4 is a rear surface electrode (1000 Å-several $\mu$m). In FIG. 3, the transparent electrode 2 can be seen to have a rough or uneven surface facing the amosphous semiconductor layer 3.

Figure 4:
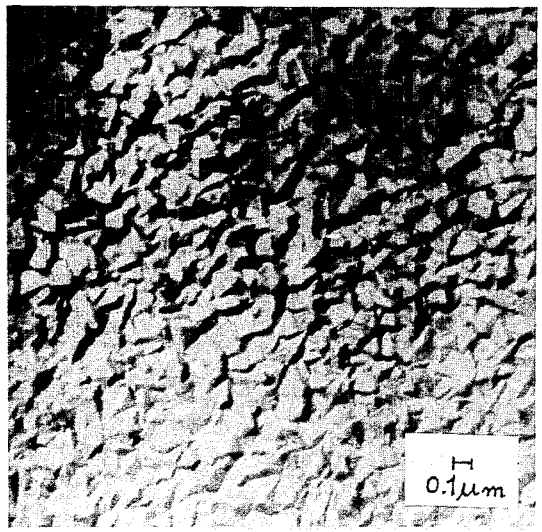
Figure 5:
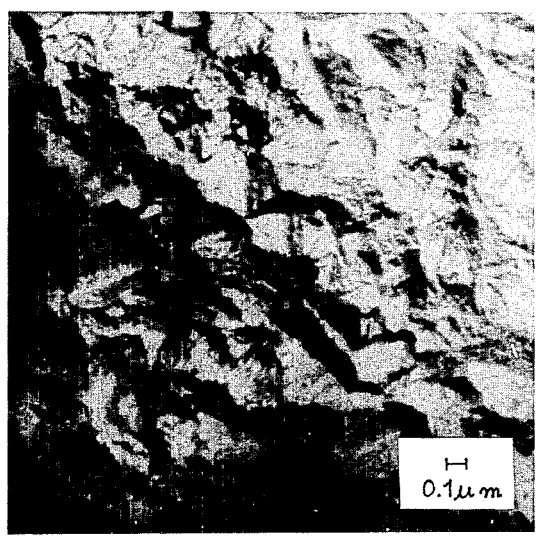

FIGS. 4 and 5 are microphotographs ($\times$30,000) showing the surface morphology of the tin oxide films formed by a spray process and having average grain diameters of about 0.3 $\mu$m and about 0.6 $\mu$m, respectively.

The respective transparent electrodes formed by using the three kinds of materials used in the example gradually are increased in cloudiness or white turbidity, as viewed from the rear surface side with the naked eye, as the average grain diameters thereof becomes larger than 0.1 $\mu$m. But, it has been found by the foregoing experiments that the cloudiness or turbidity does not decrease the conversion efficiency of the solar battery but rather increases the conversion efficiency very substantially. The transparent electrodes look darker than conventional ones as viewed from the glass substrate side, and can be clearly distinguished from conventional ones.

FIG. 6 is a microphotograph ($\times$30,000) showing the surface morphology of the transparent electrode of a conventional solar battery of about 0.05 $\mu$m in average grain diameter.

The conversion efficiency is about 1.8% when the average grain diameter is about 0.05 $\mu$m.

EXAMPLE 2

SnCl$_4$ and SbCl$_5$ and pure water serving as an oxidizing agent are used as starting materials. Preferable conditions for carrying out the process are as follows: Substrate temperature range 350°-500° C., film forming speed 10-100 Å/min., SnCl$_4$ partial pressure 0.06-0.5

Torr, SbCl$_5$ partial pressure 0.006–0.05 Torr, and H$_2$O partial pressure 0.1–1 Torr. Three bubblers containing the starting materials are set to be −30° C., −25° C. and −15° C. respectively, and the flow rates of a carrier gas (Ar) are set to be 100–600 c.c./min., 100–600 c.c./min. and 100–500 c.c./min., respectively, whereby antimony doped tin oxide films are formed by a CVD process, on glass substrates heated to 300°–500° C. The average grain diameter of the surface of each film is set to be varied to have substantially the same range of 0.1–3.0 μm obtained in Example 1 and at the same time the sheet resistance of each film is set to be about 50 Ω/sq. by changing the carrier gas flowing rate, the substrate temperature, the film thickness, etc. In almost the same manner as in the Example 1, an amorphous silicon layer comprising p-i-n layers is deposited on each of the films and thereafter an aluminum electrode is formed on each amorphous silicon layer by a vacuum evaporation treatment, so that a solar battery according to this invention is obtained.

This example is the case where an antimony doped SnO$_2$ film for a solar battery is formed by the CVD process, and the relations between the conversion efficiency and the average grain diameter ranging from 0.1 to 3.0 μm for each case have been examined, and it has been found that the conversion efficiency is greatly increased with the average grain diameter ranging from about 0.1 μm to 1 μm, and the highest efficiency of about 7% being obtained with the average grain diameters of about 1 μm.

Thus, it has been confirmed by Example 2 that the relations between the average grain diameter and the conversion efficiency show almost the same tendency as those in Example 1, even if the film manufacturing processes are different.

EXAMPLE 3

Here, there is shown an example in which an indium oxide film and an indium tin oxide film are formed by a vacuum evaporation process. The indium oxide film is formed such that an indium metal (Purity 99.999%) is evaporated on a glass substrate from a molybdenum made boat by a conventional resistance heat process and at the same time oxygen to be introduced is set to be $10^{-3}$ and $10^{-5}$ Torr. Preferable conditions for forming the indium oxide film and the tin oxide film by the vacuum evaporation process are as follows: Substrate temperature range 250°–400° C., Film forming speed 100 Å/min.–500 Å/min., and oxygen gas partial pressure $1\times10^{-4}$–$5\times10^{-3}$ Torr. The average grain diameter of each film is varied by changing the substrate temperature in the range of 200°–500° C., the amount of evaporation and the amount of oxygen gas introduced so that indium oxide films are obtained which have respectively varied grain diamters in the range of about 0.1–3 μm but have the same sheet resistance values of about 20 Ω/sq.

The indium tin oxide films are formed so that each of the pellets, which contains from about 0% to 10% by weight of Sn in relation to In, is irradiated by an electron beam such that it is heated and evaporated onto a glass substrate, and at the same time oxygen to be introduced is set to be at $10^{-3}$–$10^{-5}$ Torr, whereby In$_2$O$_3$ and SnO$_2$ are deposited on each of glass substrate heated to 200°–500° C. The average grain diameters of each film are changed by controlling the substrate temperature, the amount of evaporation, the film thickness and other conditions, so that indium tin oxide films are obtained which have respectively varied grain diameters in the range of about 0.1–3 μm but have the same sheet resistance values of about 10 Ω/sq.

Thereafter, in almost the same manner as in Example 1, solar batteries each having the construction of glass substrate/transparent electrode/p-i-n/aluminum are prepared, with the p-i-n layers and the aluminum layer being put in layes on each of the indium oxide films and on each of the indium tin oxide films. As for battery samples the relations between the efficiency and the average grain diameter were examined. As a result, it has been confirmed that an increase in conversion efficiency is made according to an increase in the average grain diameter and also the highest efficiency of about 5.5% is obtained with the average grain diameter of about 1 μm.

Additionally, almost the same tendency as in the above case has been obtained with an antimony doped tin oxide film formed by an electron beam vacuum evaporation process which is thereafter subjected to a heat treatment in atmospheric air.

Thus, it has become clear from the foregoing examples that by setting the average grain diameter of the surface of any of the transparent electrodes of various kinds of materials formed by various film forming processes to be any desired one falling in the range of 0.1–2.5 μm there can be obtained a transparent electrode having an excellent conversion efficiency of above about 4% which is much better than that (about 2% at the highest) of a conventional transparent electrode with the average grain diameter of about 0.05 μm which has been used because of its good transparency. Additionally, it has also become clear from the Examples 1, 2, 3 and that conversion efficiency is higher in the case where a transparent film chiefly composed of tin oxide is selected as the transparent electrode material rather than other transparent electrode materials of indium oxide or indium tin oxide.

Though the solar battery of the construction of glass substrate/transparent electrode/p-i-n/rear surface electrode is used in the foregoing examples, almost the same good results are obtained with a solar battery of the construction of glass substrate/transparent electrode/n-i-p/rear surface electrode.

Additionally, a further increase in the conversion efficiency to 7–7.8% is obtained when the transparent electrode of this invention is used for a type of solar battery in which the p layer, or the n layer of the amorphous silicon layer thereof in either of the foregoing constructions has carbon added thereto. Additionally, this invention is applicable to a solar battery of which the amorphous layer is amorphous germanium-silicon alloy.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalency of the claims are, therefore, to be embraced therein.

What is claimed is:

1. An amorphous semiconductor solar cell comprising a glass substrate, a transparent electrode means coated on said substrate, an amorphous semiconductor layer coated on said transparent electrode means, and a rear electrode on said amorphous semiconductor layer, wherein the average grain diameter of the surface of the transparent electrode means which faces the amorphous semiconductor layer ranges from 0.1 μm to 2.5 μm, and wherein said transparent electrode means has a rough and uneven surface facing said amorphous semiconductor layer for causing diffusion of the incident light.

2. An amorphous semiconductor solar cell of claim 1, wherein the transparent electrode is a film comprising tin oxide.

3. An amorphous semiconductor solar cell of claim 2, wherein the film consists essentially of antimony doped tin oxide.

4. An amorphous semiconductor solar cell of claim 1, wherein the transparent electrode is a film comprising indium oxide.

5. An amorphous semiconductor solar cell of claim 4, wherein the film consists essentially of indium tin oxide.

* * * * *